United States Patent
Tseng et al.

(10) Patent No.: US 11,531,065 B2
(45) Date of Patent: Dec. 20, 2022

(54) MULTI-CHANNEL TIMING CALIBRATION DEVICE AND METHOD

(71) Applicant: YOUNGTEK ELECTRONICS CORPORATION, Hsinchu (TW)

(72) Inventors: Ching-Yung Tseng, Hsinchu (TW); Yu-Chih Cheng, Hsinchu (TW); Ping-Lung Wang, Hsinchu (TW)

(73) Assignee: YOUNGTEK ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 17/460,298

(22) Filed: Aug. 29, 2021

(65) Prior Publication Data

US 2022/0146575 A1    May 12, 2022

(30) Foreign Application Priority Data

Nov. 11, 2020 (TW) ................. 109139301

(51) Int. Cl.
*G01R 31/319* (2006.01)
*G01R 31/3193* (2006.01)

(52) U.S. Cl.
CPC ... *G01R 31/31922* (2013.01); *G01R 31/3191* (2013.01); *G01R 31/31937* (2013.01)

(58) Field of Classification Search
None
See application file for complete search history.

(56) References Cited

FOREIGN PATENT DOCUMENTS

| | | |
|---|---|---|
| CN | 103941105 A | 7/2014 |
| TW | 548421 B | 8/2003 |

*Primary Examiner* — Guerrier Merant
(74) *Attorney, Agent, or Firm* — Li & Cai Intellectual Property Office

(57) ABSTRACT

A multi-channel timing calibration device and a method applicable thereto are provided. The device includes: a plurality of channel inputs, at least one relay switch, at least one comparator, at least one first multiplexer, and a time measurement chip. The at least one comparator is connected to the at least one relay switch, and connected to a reference voltage or a digital analog converter. The at least one first multiplexer has different signals for different channel groups and outputs a signal of a designated channel. The time measurement chip calculates a timing difference of each of the channels of each of the channel inputs as a basis for delay of the timing signals.

10 Claims, 6 Drawing Sheets

MULTI-CHANNEL TIMING CALIBRATION DEVICE AND METHOD

CROSS-REFERENCE TO RELATED PATENT APPLICATION

This application claims the benefit of priority to Taiwan Patent Application No. 109139301, filed on Nov. 11, 2020. The entire content of the above identified application is incorporated herein by reference.

Some references, which may include patents, patent applications and various publications, can be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a multi-channel timing calibration device and method, and more particularly to a multi-channel timing calibration device and a method applicable thereto, which are applicable on channels of a massive level number and capable of effectively calibrating timing difference among each of the channels through a single calibration device.

BACKGROUND OF THE DISCLOSURE

Referring to FIG. 1, currently, regarding the transmission of multi-channel signals, due to respective differences among components, differences among timings of the channels occur. As shown in FIG. 1, on the left side of FIG. 1, it is demonstrated that, under a comparison between each of channels 1 to 4 and a reference standard, respectively, the respective timing differences exist among the channels. The arrow indicates that after a timing calibration, a timing diagram as shown on the right side of FIG. 1 can be expected, i.e., the timing of each of the channels are consistent, and the timing of each of the channels from channel 1 to channel 4 are synchronized without deviations. Furthermore, referring to FIG. 2, a basic circuit structure having a single channel is provided, the basic circuit structure includes a driving data, the driving data is connected to a delayer and then connected to a driver, and an output end of the driver is a terminal of the channel. The terminal of the channel is then feedback connected to an input end of a comparator, and another input end of the comparator is connected to a reference voltage. Afterwards, the comparator outputs a comparison data as a reference data for comparing the timing differences.

As shown in the circuit structure of FIG. 2, since there are differences of characteristics of the drivers and the comparators, differences of length of the circuit, etc., the timing differences of timing comparison between multiple channels exist. However, when differences of the timings of the channels occur, as shown in the timing diagram on the left side of FIG. 1, the timing differences cannot produce aligned waveforms at the terminal of the channel, and a time difference also exists between the terminal of the channel and the comparison data of the comparator. Currently, a conventional solution is to adopt the "short-circuit device interface panel". The conventional structure that adopts the short-circuit device interface panel calibrates a path of the comparator and then calibrates a path of the driver. However, as shown in FIG. 3, when a number of the channels is large or of a massive level, a calibration method is usually required to further include a second or even a third device interface panel for further calibration. In order to apply the conventional technology in FIG. 3 to a condition with a large number of the channels, the device interface panel is arranged to include two calibration panels, i.e., the device interface panel 1 and the device interface panel 2 (the device interface panel is also known as the calibration panel). Convergent points on the right side of the device interface panel 1 and a convergent point on the right side of the device interface panel 2 are both regarded as signal sources. However, the conventional technology disclosed in FIG. 3 requires two calibration panels, i.e., two circuit boards to perform the multi-channel timing calibration. Furthermore, when more channels are required for input, additional circuit boards must be added. In this way, not only is the calibration complicated and the cost increased, the calibration efficiency also decreases.

SUMMARY OF THE DISCLOSURE

In response to the above-referenced technical inadequacies, the present disclosure provides a multi-channel timing calibration device and a method applicable thereto, which are applicable on channels of a massive level number and capable of effectively detecting and then calibrating the timing differences among each of the channels through a single calibration device (i.e., a single calibration panel), such that timing of the terminal have consistent and aligned waveforms, and that the calibration of the timing differences is accurately performed. Therefore, time differences are prevented from occurring, and using only a single circuit board significantly reduces the cost.

In one aspect, the present disclosure provides a multi-channel timing calibration device including a plurality of channel inputs, at least one relay switch, at least one comparator, at least one first multiplexer, and a time measurement chip. A timing signal is loaded in a channel of each of the channel inputs. An input end of the at least one relay switch is connected to the channel inputs. A first input end of the at least one comparator is connected to an output end of the at least one relay switch, a second input end of the at least one comparator is connected to a reference voltage, an output end of the at least one comparator outputs a first channel group. The at least one first multiplexer includes a plurality of input ends and an output end. One of the input ends of the at least one first multiplexer is connected to the first channel group. The input ends of the at least one first multiplexer are further connected to a plurality of channel groups. The output end of the at least one first multiplexer is channel groups 1-8. The time measurement chip includes a synchronizing signal input end and at least one event end, the at least one event end is connected to the channel groups 1-8, and the synchronizing signal input end is connected to a reference signal. The time measurement chip calculates a timing difference of each of the channels of each of the channel inputs as a basis for delay of the timing signals.

These and other aspects of the present disclosure will become apparent from the following description of the embodiment taken in conjunction with the following drawings and their captions, although variations and modifications therein can be affected without departing from the spirit and scope of the novel concepts of the disclosure.

BRIEF DESCRIPTION OF THE DRAWINGS

The described embodiments can be better understood by reference to the following description and the accompanying drawings, in which.

DETAILED DESCRIPTION OF THE EXEMPLARY EMBODIMENTS

Figure 1:
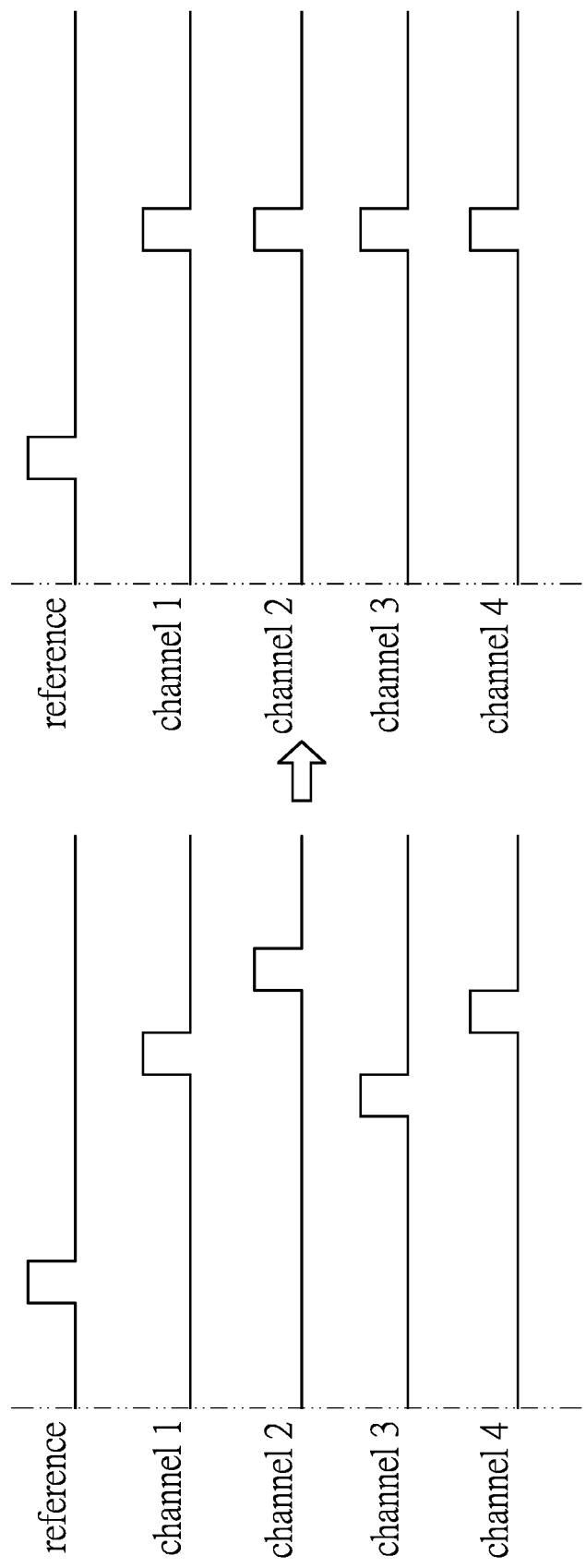
FIG. 1 is a schematic view showing the purpose of a conventional multi-channel timing calibration.
Figure 2:
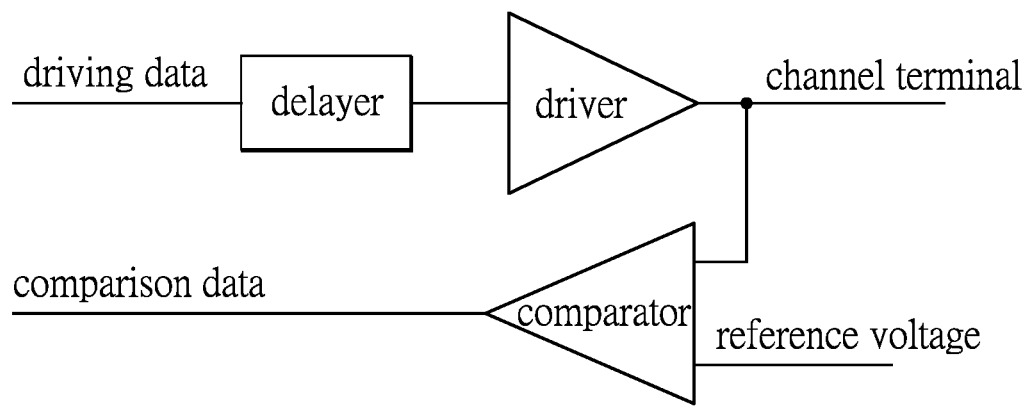
FIG. 2 is a schematic view of a conventional basic structure of a channel.
Figure 3:
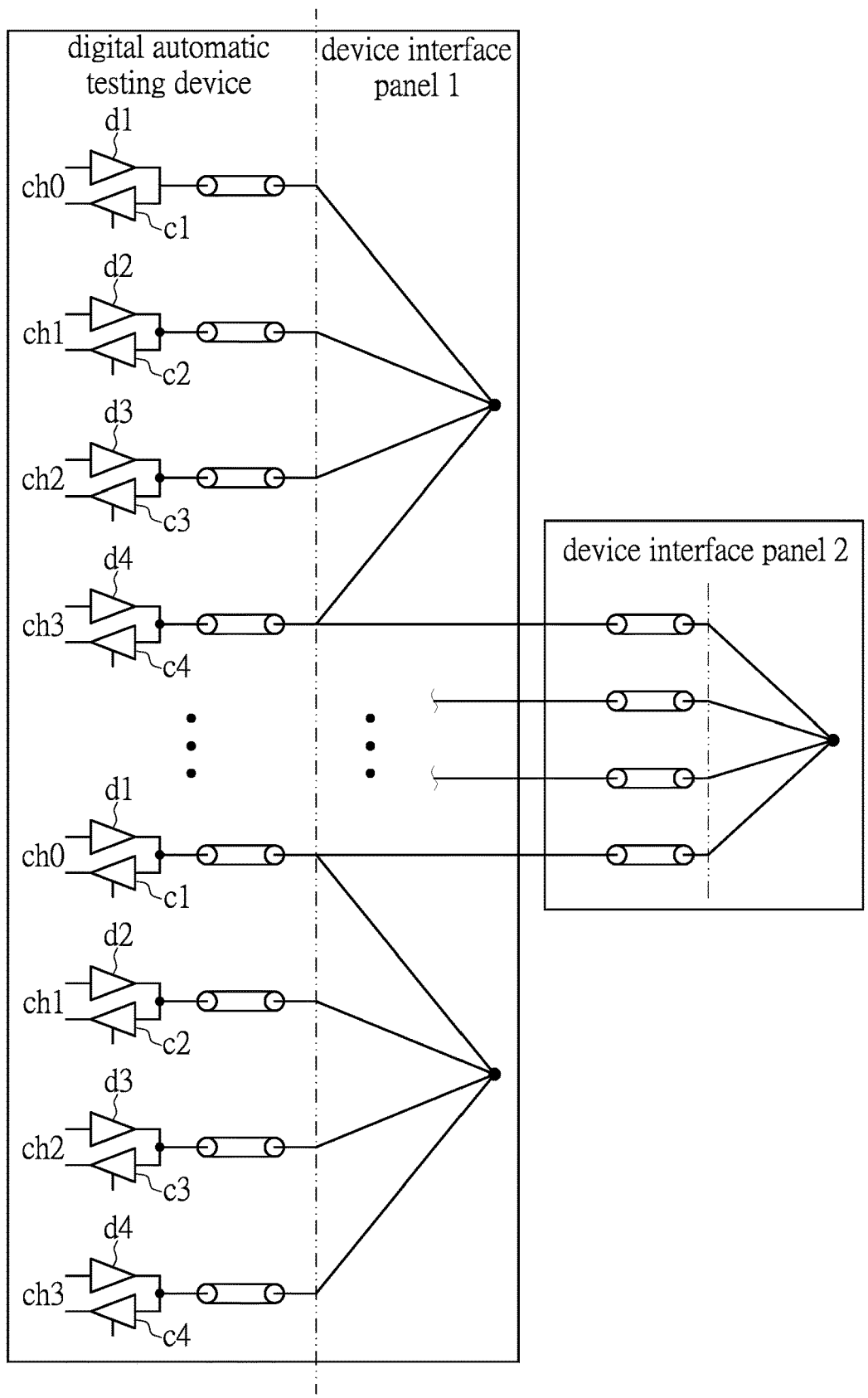
FIG. 3 is a schematic view showing a conventional solution for multi-channel timing issues.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

The present disclosure provides a multi-channel timing calibration device and a method applicable thereto, which are applicable on channels of a massive level number and capable of effectively detecting and then calibrating timing difference among each of the channels through a single calibration device, such that timing of the terminal has consistent and aligned waveforms.

Figure 4:
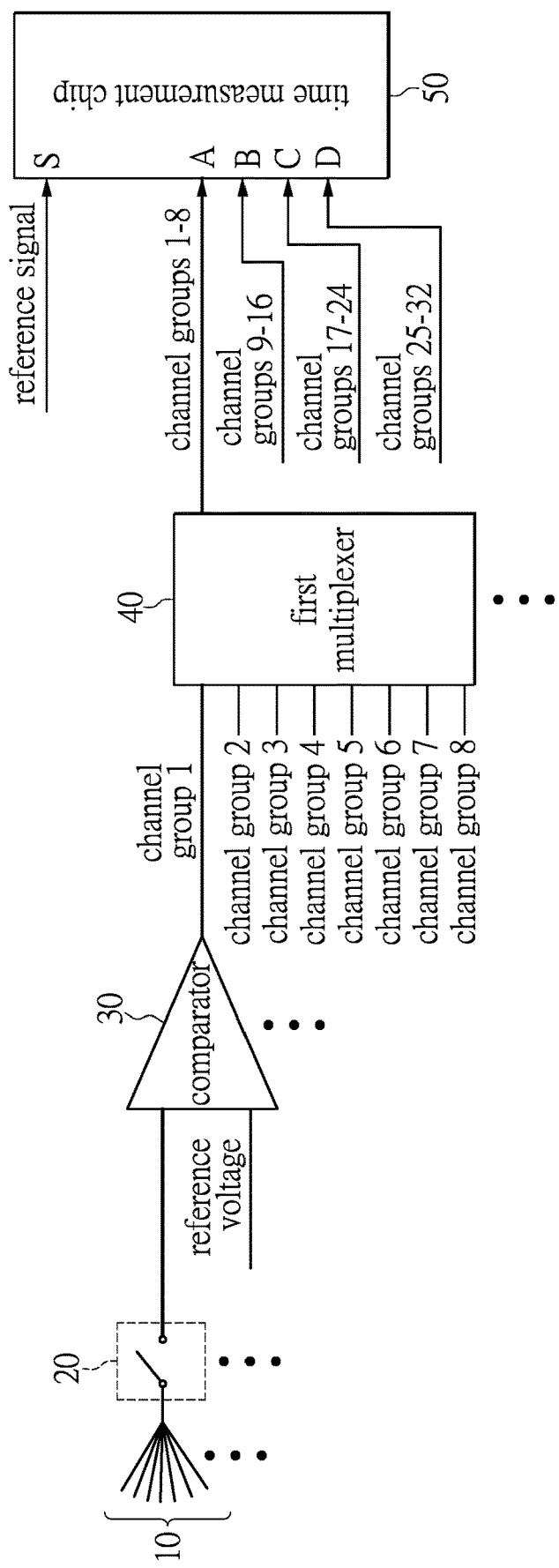
FIG. 4 is a schematic view of a circuit according to a first embodiment of the present disclosure.

Refer to FIG. 4, which is a circuit block diagram of the first embodiment of the multi-channel timing calibration device of the present disclosure. In practice, the timing calibration device of the present disclosure can also be called a "calibration board", and the present disclosure does not limit a specific name thereof, and can be adjusted according to actual or commercial requirements of a user. As shown in FIG. 4, the multi-channel timing calibration device includes a plurality of channel inputs 10, a plurality of relays 20, a plurality of comparators 30, a plurality of first multiplexers 40, and a time measurement chip 50. It should be noted that, in practice, when implementing the embodiment of the present disclosure, when the number of the channels of the user is not that many, the multi-channel timing calibration device of the present disclosure is still operable by only adopting a single relay 20, a single comparator 30, and a single first multiplexer 40. That is to say, in practice, the embodiment of the multi-channel timing calibration device of the present disclosure can also include one or more relays 20, one or more comparators 30, and one or more first multiplexers 40 (i.e., at least one relay switch 20, at least one comparator 30, and at least one first multiplexer 40). Each of the channels of the channel inputs 10 is loaded with a timing signal. The timing signals can be, for example, the channel timing signals as shown in FIG. 1; furthermore, a convergent point of the channel inputs 10 can be regarded as a signal source. In other words, a plurality of groups of channel inputs 10 indicates that there are a plurality of convergent points, indicating that there are a plurality of signal sources. However, the present disclosure is not limited to one signal source or a plurality of signal sources.

An input end of the relay switch 20 (which can be one or more relay switches 20 as described above) is connected to the channel inputs 10. When the groups of the channel inputs 10 are respectively connected to the relay switches 20, the relay switches 20 serve as switches or gates for the timing signals of the channel inputs 10 that enter the multi-channel timing calibration device. When the relay switches 20 are off (e.g., turned off or disconnected), the timing signals of the channel inputs 10 do not enter the multi-channel timing calibration device; when the relay switches 20 are on (e.g., turned on or connected), the timing signals of the channel inputs 10 enter the multi-channel timing calibration device. The multi-channel timing calibration device of the present disclosure can be implemented as one or more comparators 30. A first input end of the comparator 30 (e.g., an input at an upper side of the input end of the comparator 30 as shown in FIG. 4) is connected to second input ends of the aforementioned relay switches 20, and an output end of the comparator 30 (e.g., an input at a lower side of the input end of the comparator 30 as shown in FIG. 4) is connected to a reference voltage. The output end of the comparator 30 then outputs a first channel group (i.e., the channel group 1 as shown in FIG. 4). The first multiplexer 40 can also be implemented as one or more first multiplexers 40, the first multiplexer 40 has a plurality of input ends (as shown on the left side of the first multiplexer 40 in FIG. 4) and an output end (as shown on the right side of the first multiplexer 40 in FIG. 4). One of the input ends of the first multiplexer 40 is connected to the aforementioned first channel group (i.e., channel group 1). In addition, as shown in FIG. 4, the input ends of the first multiplexer 40 are further connected to the rest of the channel groups including the second, the third, the fourth, the fifth, the sixth, the seventh, and the eighth channel groups (i.e., channel group 2 to channel group 8, as shown in FIG. 4). After that, after a multiplex selection of the first multiplexer 40, the output end of the first multiplexer 40 is the timing signals of channel groups 1-8. In practice, the timing signals of the channel groups 1-8 can be a designated channel signal or a designated channel group signal.

The time measurement chip 50 shown in FIG. 4 includes a synchronization signal input end S and at least one event end. In practice, according to actual operation requirements of the users, the time measurement chip 50 can have only a single event end or a plurality of event ends serving as the input end(s) for the timing signals. In one embodiment, as shown in FIG. 4, the at least one event end is exemplified as a first event end A, a second event end B, a third event end C, and a fourth event end D, and the first event end A is connected to the timing signals of the channel groups 1-8 outputted by the aforementioned first multiplexer 40. In addition, a reference signal is connected to the synchronization signal input end S as a time reference for measuring the timing signals of the channels. The time measurement chip 50 calculates the timing signal differences among each of the channel inputs 10, which can be used as a basis for timing signal delay control. In another embodiment, when the groups of the channel inputs 10 are in cooperation with the relay switches 20, the comparators 30, and the first multiplexers 40, in the measurement time chip 50, the first event end A inputs the channel groups 1-8, the second event end B inputs channel groups 9-16, the third event end C inputs channel groups 17-24, and the fourth event end D inputs channel groups 25-32.

Figure 5:
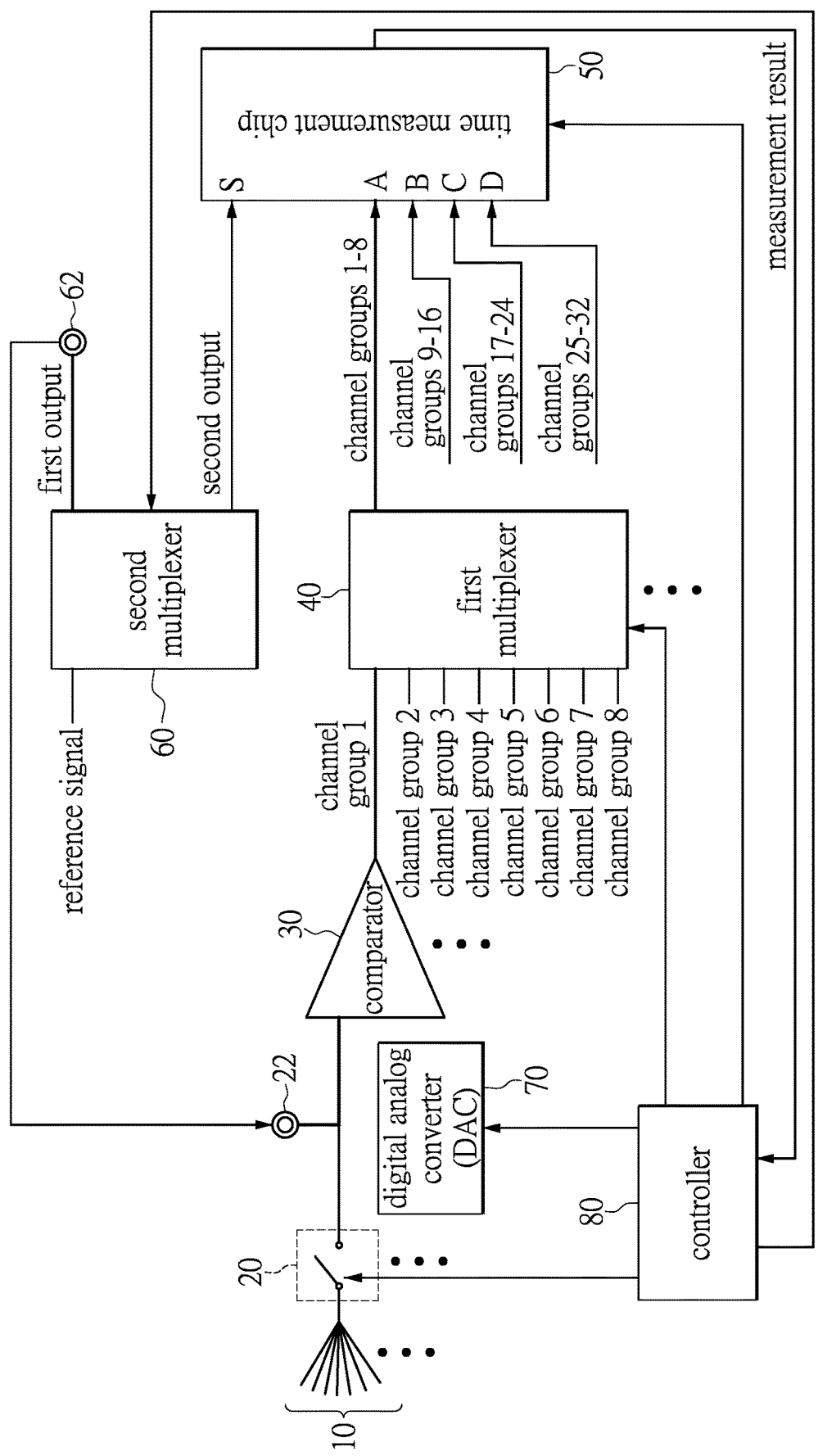
FIG. 5 is a schematic view of a circuit according to a second embodiment of the present disclosure.

Referring to FIG. 5, which is a schematic circuit diagram of the second embodiment of the present disclosure. In addition to the aforementioned channel inputs 10 (which can also be implemented as the groups of the channel inputs 10), the relay switches 20 (which can also be implemented as a single relay switch 20), the comparators 30 (which can also be implemented as a single first comparator 30), the first multiplexers 40 (which can also implemented as a single first multiplexer 40), and the time measurement chip 50, the multi-channel timing calibration device further includes a digital analog converter (DAC) 70 and a controller 80. The DAC 70 can be used to replace the aforementioned reference voltage. In the second embodiment, the DAC 70 can meet the requirements of a user and generate a reference voltage waveform signal required by the user which serves as a signal for a second input end of the comparator 30 (i.e., the upper input end of the comparator 30 input end). Furthermore, the DAC 70 can be used as a waveform generator for generating waveforms, so as to generate a timing waveform for reference that serves as a reference value for timing calibration. As shown in FIG. 5, the controller 80 is simultaneously connected to the relay switch 20 (which can be one or more relay switches 20), the DAC 70, and the first multiplexer 40 (which can be one or more first multiplexers 4), and the time measurement chip 50. The controller 80 receives the output signal of the time measurement chip 50 as a reference for the feedback of the timing signal, so as to facilitate the overall control of the calibration panel of the multi-channel timing calibration device of the present disclosure. After the controller 80 calculates a delay status of each of the timing signals, the controller 80 further controls the DAC 70 and the aforementioned first multiplexer 40 to perform and operate the required timing calibration, and to adjust and delay the timing signals of the channels having timing differences. Therefore, the timing output of each of the channels in the calibration panel of the multi-channel timing calibration device of the present disclosure is consistent and aligned.

Figure 6:
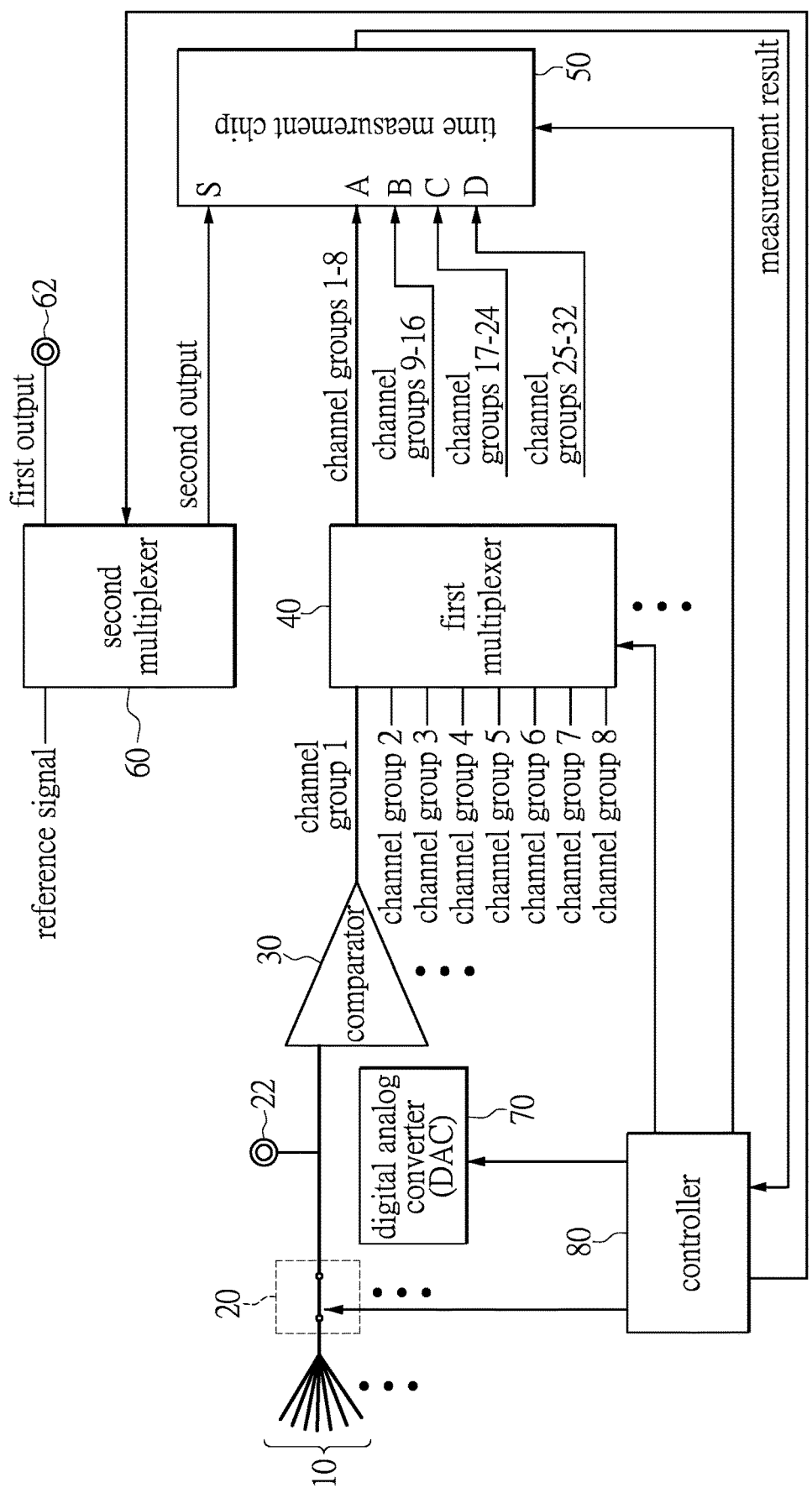
FIG. 6 is a schematic view of a circuit in another state according to the second embodiment of the present disclosure.

In another embodiment, as shown in FIG. 5, the multi-channel timing calibration device includes a second multiplexer 60, which is another reference implementation in the second embodiment of the present disclosure. The second multiplexer 60 in the another reference implementation can serve as a reference for calibrating the timing differences of the multi-channel timing calibration device of the present disclosure. In other words, the second multiplexer 60 can serve as the reference for calibrating the timing differences of the calibration panel itself. As for the calibration panel, being able to calibrate the timing differences of the multi-channel timing calibration device is also important. FIG. 5 shows the calibration of the timing differences of the calibration panel of the multi-channel timing calibration device of the present disclosure, and FIG. 6 shows the calibration of the status of the multi-channel timing calibration device of the present disclosure after a general channel timing signal comes in after the device is calibrated. The second multiplexer 60 has an input end (as shown on the left side of the second multiplexer 60 as shown in FIG. 5), and a reference signal is connected to the input end as a reference for calibrating the timing differences of the calibration panel itself. In addition, a first output and a second output are on the right side of the second multiplexer 60, and the second output is connected to the synchronization signal input end S in the time measurement chip 50. In another implementation of the second embodiment, the multi-channel timing calibration device of the present disclosure further includes a first coaxial radio frequency connector 22, e.g., a SubMiniature version A (SMA) connector, and a second coaxial radio frequency connector 62, e.g., an SMA connector. The first coaxial radio frequency connector 22 is connected between the relay switch 20 and the first input end of the at least one comparator 30, and the second coaxial radio frequency connector 62 is connected to the first output of the second multiplexer 60. In practice, in addition to directly connecting the second output of the second multiplexer 60 to the first input end of the at least one comparator 30, which is a direct jumper connection, a pair of coaxial radio frequency connectors can also be adopted as the medium for the jumper connection, such that the timing differences of the calibration panel itself can be measured.

Similarly, in the embodiment shown FIG. 5, the time measurement chip 50 includes a synchronization signal input end S and at least one event end. In practice, according to actual operation requirements of the users, the time measurement chip 50 can have only a single event end or a plurality of event ends serving as the input end(s) for the timing signals. In one embodiment, as shown in FIG. 5, the at least one event end is exemplified as a first event end A, a second event end B, a third event end C, and a fourth event end D, and the first event end A is connected to the timing signals of the channel groups 1-8 outputted by the aforementioned first multiplexer 40. The time measurement chip 50 calculates the timing signal differences among each of the channel inputs 10, which can be used as a basis for timing signal delay control. In addition, after the time measurement chip 50 calculates the delay status of each of the timing signals, the time measurement chip 50 further controls the DAC 70 and the first multiplexer 40 to adjust and delay the channels having the timing differences, such that a timing of each of the channels in the calibration panel of the device of the present disclosure are consistent. Furthermore, when the groups of the channel inputs 10 are cooperation with the relay switches 20, the comparators 30, and the first multiplexers 40, in the measurement time chip 50, the first event end A inputs the channel groups 1-8, the second event end B inputs channel groups 9-16, the third event end C inputs channel groups 17-24, and the fourth event end D inputs channel groups 25-32.

References are further made to FIG. 5 and FIG. 6, the multi-channel timing calibration method according to embodiments of the present disclosure can be further explained. It should be noted that the multi-channel timing calibration method of the present disclosure is mainly used in the multi-channel timing calibration device as shown in FIG. 4 and FIG. 5, the multi-channel timing calibration method includes: calibrating a general comparator path first; calibrating the general driver path; calibrating a timing differences of the multi-channel timing calibration device, including the following steps: turning off the relay switch 20, as shown in FIG. 5; connecting the second output of the second multiplexer 60 to the first input of the at least one comparator 30, as shown in FIG. 5; measuring the timing differences of the channel groups by the time measurement chip 50; and calibrating the timing of each of the channels by the controller 20, according to the timing differences serving as a basis of timing calibration. Afterwards, as shown in FIG. 6, the calibration of the timing of each of the channel groups includes: disconnecting the second output of the second multiplexer 60 and the first input of the at least one comparator 30; at the same time; turning on the relay switch 20, as shown in FIG. 6; so as to measure the timing differences of the channel groups by the time measurement chip 50; and calibrating the timing of each of the channels by the controller 80, according to the timing differences serving as the basis of timing calibration.

BENEFICIAL EFFECTS OF THE EMBODIMENT

In conclusion, the multi-channel timing calibration device and the method applicable thereto of the present disclosure not only develops a multi-channel timing calibration device with a single circuit board device, but also significantly reduces the cost of the circuit board, and can be further applied to calibrating the timing signals of the multi-channel groups and effectively used in the technical field of massive level amount of channel groups or calibrating the timing differences of massive level amount of channel groups. Therefore, the overall area and volume of the calibration device is reduced, and the device is more conveniently connected to the multi-channel groups to be calibrated.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A multi-channel timing calibration device, comprising:
   a plurality of channel inputs, a timing signal being loaded in a channel of each of the channel inputs;
   at least one relay switch, an input end of the at least one relay switch being connected to the channel inputs;
   at least one comparator, a first input end of the at least one comparator being connected to an output end of the at least one relay switch, a second input end of the at least one comparator being connected to a reference voltage, an output end of the at least one comparator outputting a first channel group;
   at least one first multiplexer including a plurality of input ends and an output end; wherein one of the input ends of the at least one first multiplexer is connected to the first channel group; wherein the input ends of the at least one first multiplexer are further connected to a plurality of channel groups; wherein the output end of the at least one first multiplexer is channel groups 1-8; and
   a time measurement chip including a synchronizing signal input end and at least one event end, the at least one event end being connected to the channel groups 1-8, and the synchronizing signal input end connected to a reference signal; wherein the time measurement chip calculates a timing difference of each of the channels of each of the channel inputs as a basis for delay of the timing signals.

2. The multi-channel timing calibration device according to claim 1, further comprising a digital analog converter for replacing the reference voltage, wherein the digital analog converter is capable of generating a reference voltage waveform signal required by a user, which serves as a second input end signal of the at least one comparator.

3. The multi-channel timing calibration device according to claim 2, further comprising a controller, the controller being connected to the relay switch, the digital analog converter, the at least one first multiplexer and the time measurement chip, and the controller receiving an output signal of the time measurement chip; wherein, after the time measurement chip calculates a delay status of each of the timing signals, the controller controls the digital analog converter and the at least one first multiplexer to adjust and delay the channels having the timing differences, such that a timing of each of the channels are consistent.

4. The multi-channel timing calibration device according to claim 1, wherein the at least one event end of the time measurement chip includes: a first event end, a second event end, a third event end, and a fourth event end; wherein the first event end inputs the channel groups 1-8, the second event end inputs channel groups 9-16, the third event end inputs channel groups 17-24, and the fourth event end inputs channel groups 25-32.

5. The multi-channel timing calibration device according to claim 1, wherein the channel groups connected to the input ends of the at least one first multiplexer are different channel groups including the channel groups 2-8.

6. The multi-channel timing calibration device according to claim 1, wherein the at least one event end of the time measurement chip includes: a first event end, a second event end, a third event end, and a fourth event end; wherein the first event end inputs the channel groups 1-8, the second event end inputs channel groups 9-16, the third event end inputs channel groups 17-24, and the fourth event end inputs channel groups 25-32; wherein the channel groups connected to the input ends of the at least one first multiplexer are different channel groups including the channel groups 2-8.

7. A multi-channel timing calibration device, comprising:
   a plurality of channel inputs, a timing signal being loaded in a channel of each of the channel inputs;
   at least one relay switch, an input end of the at least one relay switch being connected to the channel inputs;
   at least one comparator, a first input end of the at least one comparator being connected to an output end of the at least one relay switch, a second input end of the at least one comparator being connected to a reference voltage, an output end of the at least one comparator outputting a first channel group;

at least one first multiplexer including a plurality of input ends and an output end; wherein one of the input ends of the at least one first multiplexer is connected to the first channel group; wherein the input ends of the at least one first multiplexer are further connected to a plurality of channel groups; wherein the output end of the at least one first multiplexer is channel groups 1-8;

a second multiplexer including an input end, the input end being connected to a reference signal; wherein the second multiplexer including a first output and a second output; and a time measurement chip including a synchronizing signal input end and at least one event end, the synchronizing signal input end connected to the second output of the second multiplexer, and the at least one event end being connected to the channel groups 1-8; wherein the time measurement chip calculates differences among the timing signal of the channel of each of the channel inputs as a basis for delay of the timing signal.

8. The multi-channel timing calibration device according to claim 7, further comprising a digital analog converter for replacing the reference voltage, wherein the digital analog converter is capable of generating a reference voltage waveform signal required by a user, which serves as a second input end signal of the at least one comparator.

9. The multi-channel timing calibration device according to claim 8, further comprising a controller, the controller being connected to the relay switch, the digital analog converter, the at least one first multiplexer and the time measurement chip, and the controller receiving an output signal of the time measurement chip; wherein, after the time measurement chip calculates a delay status of each of the timing signals, the controller controls the digital analog converter and the at least one first multiplexer to adjust and delay the channels having the timing differences, such that a timing of each of the channels are consistent.

10. A multi-channel timing calibration method applicable in the multi-channel timing calibration device as described in claim 9, the multi-channel timing calibration method comprising:

calibrating a general comparator path;

calibrating a general driver path;

calibrating a plurality of timing differences of the multi-channel timing calibration device, including the following steps:

turning off the relay switch;

connecting the second output of the second multiplexer to the first input end of the at least one comparator;

measuring timing differences by the measurement chip; and calibrating the timing of each of the channels by the controller, according to the timing differences serving as a basis of timing calibration; and calibrating the timing of the channels, including the following steps:

turning off the relay switch; and calibrating the timing of each of the channels by the controller, according to the timing differences serving as the basis of timing calibration.

* * * * *